United States Patent Office 3,396,020

Patented Aug. 6, 1968

3,396,020

PLANOGRAPHIC PRINTING PLATE

Henning H. Borchers, Mountainside, N.J., assignor to Azoplate Corporation, Murray Hill, N.J., a corporation of New Jersey No Drawing. Filed Nov. 16, 1965, Ser. No. 508,150
10 Claims. (Cl. 96—33)

This invention relates to a presensitized planographic printing plate which can be developed with water or with aqueous solutions and is of the type described in application Ser. No. 124,804, filed July 18, 1961.

Application Ser. No. 124,804 relates to a presensitized planographic printing plate comprising an aluminum support having a light-sensitive reproduction coating thereon and, between the aluminum support and the reproduction coating, a thin intermediate layer which comprises one or several phosphonic acids or phosphonic acid derivatives. Such planographic printing plates are distinguished by an excellent adhesion of the reproduction coating to the support, so that longer, in some cases even considerably longer, runs can be obtained, compared with aluminum-base planographic printing plates having no such phosphonic acid or phosphonic acid derivative-containing intermediate layer.

The light-sensitive substance in the light-sensitive reproduction coating is a condensation product prepared by condensing a diphenylamine-4-diazonium salt or a substituted diphenylamine-4-diazonium salt with formaldehyde in an acid medium. In addition thereto, the reproduction coating may contain excess phosphoric acid, if desired. Presensitized planographic printing plates of this type have excellent light-sensitivity, very good shelf-life, and are very resistant to abrasion. They may be developed with water or aqueous solutions.

The application aforementioned also discloses reproduction coatings which contain resins having groups which render them alkali-soluble, e.g. acid anhydride, carboxylic acid, sulfonic acid, sulfonamide, or sulfonimide groups.

It now has been found that presensitized planographic printing plates according to the aforementioned application and containing a resin in their reproduction coating, are considerably improved when they contain, as the resin, an amine/formaldehyde resin or several such resins, if desired in combination with other resins, preferably acetal resins. The amine/formaldehyde resins to be used may be resins prepared by condensation of formaldehyde with melamine or of formaldehyde with urea. Condensation products of this type are known and are commercially available in many modifications.

Preferably, the presensitized planographic printing plates of the present invention are prepared by adding the amine resin to a solution containing the diazo compound and which is to be applied to the aluminum support. The quantity of resin to be added may vary within wide limits; generally, it is in the range of 0.1 to 5 parts by weight of resin for each part by weight of diazo compound used. Particularly good results are obtained by adding 0.5 to 2 parts by weight of resin for each part by weight of diazo compound present.

If the light-sensitive layer contains one ar more other resins in addition to amine/formaldehyde resin, their proportion by weight should not exceed that of the amine/formaldehyde resin. The total quantity of resins added should be within the limits stated above, i.e. preferably from 0.5 to 2 parts by weight per part by weight of diazo compound. Presensitized printing plates in which the light-sensitive layer contains oil-modified alked resins in such quantities that, taken with the quantity of amine/formaldehyde resin present, they constitute at least half the resin content of the layer, are not within the scope of the present invention. The same applies to printing plates having a light-sensitive layer whose resin content is constituted by at least 50 percent of epoxide resin. In addition to the amine/formaldehyde resins there may be present, as other resins, in the reproduction coating, e.g. condensation products of polyvinyl alcohol and formaldehyde, the so-called polyvinyl acetal resins. Their presence results in printing plates of high efficiency as regards the length of runs obtainable.

If desired, the hydrophobic properties of the light-sensitive layers, their processibility, and the length of run obtainable may be improved by adding substances such as plasticizers, dyestuffs, fatty acids or colloids. These additives, however, must be present in small quantities only and must not total more than 20 percent by weight of the amine/formaldehyde resin present.

The planographic printing plates according to the present invention are superior to the planographic printing plates described in the aforementioned application in that they permit the printing of still longer runs, due to their improved resistance to the developers used for preparing the printing plates and to the lacquers applied, in some cases, for strengthening the plates. As an added advantage, the presensitized plates display a further improved shelf-life, particularly at elevated temperatures and high atmospheric humidity, as are encountered in the tropics. Further, it is of advantage that the planographic printing plates of the invention are much less sensitive to handling with the bare fingers.

In the following examples, the unit by volume is 1 ml., when 1 gram is the unit by weight.

Example 1

An aluminum plate of 0.1 mm. thickness was mechanically roughened by brushing and then provided with a Bohmite layer by immersing it for 10 minutes in a 2% ammonia solution at 80° C. The plate was then immersed for 10 seconds at 70° C. in a bath containing a 0.5 percent by weight solution of polyvinyl phosphonic acid in water, and dried. The thus pretreated surface of the aluminum plate then was coated by applying a solution of the following composition:

| | Parts by wt. |
|---|---|
| Condensation product of diphenylamine-4-diazonium phosphate and formaldehyde, prepared in phosphoric acid and separated in the form of the acid phosphate of the condensation product as described described in Example 11 of application Ser. No. 124,804 | 1 |
| Melamine resin with an acid number below 1 (Resimene 882) | 2 |
| Water | 10 |
| Glycol monoethyl ether | 87 |

The coated aluminum foil was dried and could be stored for many months in the dark.

For the preparation of a printing plate, the presensitized plate was exposed for 40 seconds, under a photographic negative, to a 60 amp arc lamp at a distance of 70 cm. The exposed layer was developed with an aqueous 8 percent gum arabic solution, applied by means of a swab, and then inked up with printing ink. The plate then was ready for printing.

Example 2

A bright, rolled aluminum foil of 0.1 mm. thickness was immersed for 1 minute in water at 80° C. containing 1 percent by weight of polyvinyl phosphonic acid and 0.2 percent of vinyl phosphonic acid. After drying, the foil was coated with a solution of the following composition:

| | Parts by wt. |
|---|---|
| Crude condensation product (i.e. one which was not separated from the phosphoric acid used in the condensation) prepared by condensing 3.3 parts by weight of paraformaldehyde with 23 parts by weight of diphenylamine-4-diazonium chloride in 42 parts by weight of 85 percent phosphoric acid | 0.4 |
| Unplasticized melamine resin having an acid number below 1 (Resamin 511 F) | 1.0 |
| Polyvinyl acetal having a viscosity of 4–6 contipoises at 20° C. in a 2 percent solution in methylene chloride (Mowital F 40) | 0.1 |
| Butyl acetate | 8.0 |
| Xylene | 10.0 |
| Ethyleneglycol acetate ethyl ether | 80.0 |

For the preparation of a printing plate, the foil was exposed under a negative, then wiped over with a cotton pad soaked in an aqueous solution containing 8 percent by weight of gum arabic and 3 percent by weight of magnesium nitrate, and finally inked up with greasy ink.

Example 3

A bright, rolled aluminum foil of 0.1 mm. thickness was immersed for 1 minute in water at 80° C. which contained 1 percent by weight of polyvinyl phosphonic acid and 0.2 percent by weight of vinyl phosphonic acid. The foil was dried and then coated with a solution of the following composition:

| | Parts by wt. |
|---|---|
| Crude product (i.e. one not separated from the phosphoric acid used for the condensation) prepared by condensing 3.3 parts by weight of paraformaldehyde with 23 parts by weight of diphenylamine-4-diazonium chloride in 42 parts by weight of 85 percent phosphoric acid | 0.4 |
| An unplasticized melamine resin having an acid number below 1 (Resamin 511 F) | 0.3 |
| An alkyd resin with an acid number below 20 which, when dissolved in an equal quantity of butyl acetate, yields a solution having a viscosity of about 100 centipoises at 20° C. (Alftalat 355 A) | 0.1 |
| Xylene | 10.0 |
| Ethyleneglycol acetate ethyl ether | 80.0 |

For the preparation of a printing plate, the foil was exposed under a negative and then wiped over with a cotton pad soaked in an aqueous solution containing 8 percent by weight of gum arabic and 3 percent by weight of magnesium nitrate and then inked with greasy ink.

It will be obvious to those skilled in the art that many modifications may be made within the scope of the present invention without departing from the spirit thereof, and the invention includes all such modifications.

What is claimed is:

1. A presensitized printing plate comprising an aluminum base, a first layer thereon comprising at least one compound selected from the group consisting of an organic phosphonic acid and the esters and salts thereof, and a second reproduction layer on the first layer, the latter comprising a water-soluble diazonium condensate, prepared by condensing a diphenylamine-4-diazonium salt with formaldehyde in an acid condensation medium, in admixture with a water-insoluble organophilic resinous material at least a major portion of which is an amine resin.

2. A presensitized printing plate according to claim 1 in which the amine resin is a melamine resin.

3. A presensitized printing plate according to claim 1 in which the resinous material is a melamine resin in admixture with an acetal resin.

4. A presensitized printing plate according to claim 1 in which the resinous material is a melamine resin in admixture with an alkyd resin.

5. A presensitized printing plate according to claim 1 in which the second layer includes free phosphoric acid.

6. A process for making a printing plate which comprises exposing a coated aluminum base to radiation under a master and developing the resulting image with an aqueous developer whereby the coating is removed from the base material in the image-free areas thereof, the coating comprising a first layer comprising at least one compound selected from the group consisting of an organic phosphonic acid and the esters and salts thereof, and a second reproduction layer on the first layer, the latter comprising a water-soluble diazonium condensate, prepared by condensing a diphenylamine-4-diazonium salt with formaldehyde in an acid condensation medium, in admixture with a water-insoluble organophilic resinous material at least a major portion of which is an amine resin.

7. A process according to claim 6 in which the amine resin is a melamine resin.

8. A process according to claim 6 in which the resinous material is a melamine resin in admixture with an acetal resin.

9. A process according to claim 6 in which the resinous material is a melamine resin in admixture with an alkyd resin.

10. A process according to claim 6 in which the second layer includes free phosphoric acid.

References Cited

UNITED STATES PATENTS

| | | | |
|---|---|---|---|
| 2,626,866 | 1/1953 | Neugebauer et al. | 96—33 |
| 2,709,655 | 5/1955 | Frederick | 96—75 |
| 3,220,832 | 11/1965 | Uhlig | 96—33 X |
| 3,235,383 | 2/1966 | Steppan et al. | 96—33 |
| 3,244,523 | 4/1966 | Growald et al. | 96—75 |

OTHER REFERENCES

Blais: "Amino Resins," 1959, pp. 187–190.

NORMAN G. TORCHIN, *Primary Examiner.*

R. E. MARTIN, *Assistant Examiner.*